Nov. 11, 1969 L. V. GASSAWAY ET AL 3,478,222

CONTROL CIRCUIT

Filed May 22, 1967 2 Sheets-Sheet 1

INVENTOR.
LEE V. GASSAWAY
BY MICHAEL L. ERDKAMP

Robert E. Strauss
ATTORNEY

INVENTOR.
LEE V. GASSAWAY
MICHAEL L. ERDKAMP
BY
ATTORNEY

United States Patent Office 3,478,222
Patented Nov. 11, 1969

3,478,222
CONTROL CIRCUIT

Lee V. Gassaway, 2316 E. Santa Fe, Apt. 8, Fullerton, Calif. 92631, and Michael L. Erdkamp, 299 S. Lime, Orange, Calif. 92668

Filed May 22, 1967, Ser. No. 640,296
Int. Cl. H02j *3/14*
U.S. Cl. 307—38 6 Claims

ABSTRACT OF THE DISCLOSURE

A power control circuit for supplying rectified pulsating power to up to four load circuits in polarity and of duration that is responsive to the frequency and intensity of an input signal which comprises at least two parallel load circuits containing opposite half wave rectifiers, a triac switch between said load circuits and the alternating current supply and a triac triggering circuit which is responsive to an input signal such as an audio or musical signal. The triggering circuit has at least two channels with a frequency dividing network which splits the input signal into discrete high and low frequency signals. Opposite half phase, rectified current is supplied to the channels each of which contains one of a pair of complementary transistors with common output electrodes. The transistors amplify the discrete input signals which are applied to their base electrodes. The amplified output of the triggering circuit charges a capacitor, thereby controlling the duration of the conduction mode of the triac.

The invention relates to an electrical power control circuit for controlling the duration of a pulsating power supply to either of at least two load circuits. In its preferred embodiment, the invention relates to the control of several light circuits to vary the brilliance of the lights in response to the frequency and intensity of an audio signal.

Various circuits have been proposed for control of several light circuits in response to audio inputs. These circuits have found application in Christmas displays and as supplements to high fidelity sound systems by display of an audio signal. Separate, distinct frequency responsive channels have been used to vary the control output; however, each of these channels have required separate power circuit selector switch means. Commonly, silicon controlled rectifiers (SCR) have been used to switch the power circuit, however, an SCR is unidirectional and therefore two of these units must be employed to utilize the full phase of the power supply.

It is an object of this invention to provide full phase power control responsive to the frequency of an input signal.

It is also an object of this invention to provide full phase power control responsive to the intensity of an input signal.

It is a further object of this invention to provide such control with a minimum number of switch means.

It is additionally an object of this invention to control the power supply to a plurality of separate light channels in response to an input audio signal.

Other and related objects will be apparent from the following description of the invention.

Our invention utilizes a triac as a single switch means that is responsive to negative or positive gate signals. At least two power circuits with opposite half phase rectifier means are connected to the switch means to thereby provide two distinct polarity responsive power circuits. Similar half phase rectification is applied to either of at least two separate amplifier channels in a triggering circuit to permit the separate amplifier channels to control their respective power circuits.

The invention will now be described by reference to the figures, of which:

Figure 1:
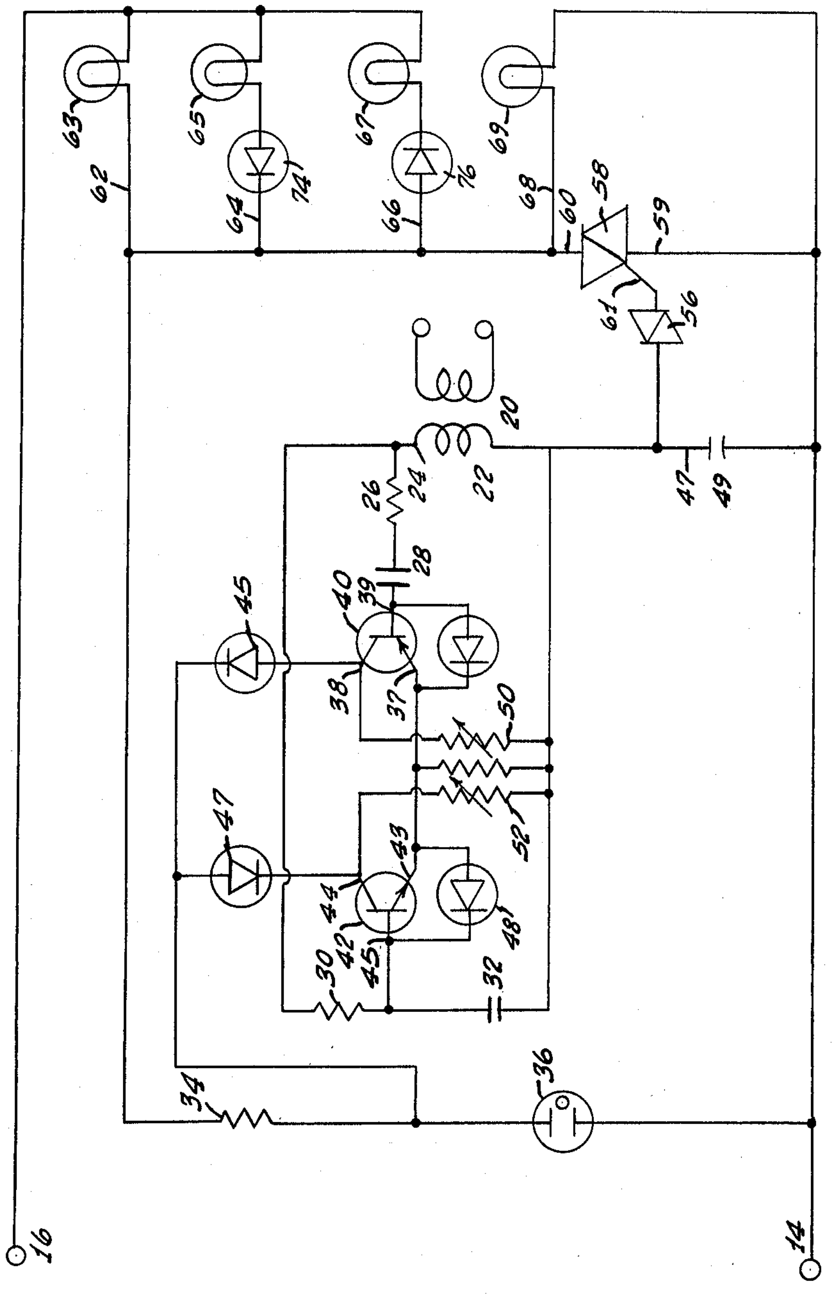
FIGURE 1 illustrates the circuit.

Referring now to FIGURE 1, the circuit is shown with terminals 14 and 16 for connection to an alternating current supply source. A register 34 and voltage regulator such as neon lamp 36 is used to protect the transsistor circuit from overvoltage.

The input signal apearing at terminals 17 and 18 is applied to the primary windings of the input transformer 20. This signal can be any alternating current signal having a wide range of frequencies, e.g., an audio input signal, an audio amplifier, receiver, record or tape player signal, etc. The transformer 20 is an isolation transformer and the output appearing at 22–24 across its secondary winding is applied to the RC frequency divider networks. The relative number of turns of the primary and secondary windings can vary to provide from a step down to a step up transformer depending on the input signal amplitude as is well known in the art. The RC networks comprise a high frequency and low frequency channel. The high frequency channel contains series resistor 26 and capacitor 28 which pass the high frequency portion of the signal to the base of transistor 40 and attenuate the low frequency portion of the input signal. The low frequency channel contains resistor 30 and capacitor 32 which pass the low frequency portion of the input signal to the base junction of transistor 42.

Each of the channels is supplied with half wave rectified current of opposite polarity by respective diodes 45 and 47. The triggering circuit contains signal repeating means in each channel which comprise a pair of complementary transistors 40 and 42. These are shown as junction type transistors having three electrodes designated as emitters 37 and 43, collectors 38 and 44 and bases 39 and 45. As shown, transistor 40 is of the PNP type and transistor 42 is complementary, of the NPN type. Other transistors such as N and P point-contact transistors or other devices which have complementary operating characteristics can also be supplied in lieu of those shown. Transistors 40 and 42 and diodes 46 and 48 are employed in common-emitter configuration as current regulating sources. Diodes 46 and 48 prevent the application of reverse over voltages on the emitter base junction of their respective transistors which can occur with high level surges in the input signal.

The output circuit for the channel amplifier means includes the two emitters 37 and 43 of the respective transsistors 40 and 42 in common connection as shown. The output is applied to the terminal 47 of capacitor 49. Shunt resistors 50 and 52 are connected in parallel to transistors 40 and 42, respectively, and are sized to provide a charge rate for capacitor 49 which insures that the capacitor will reach the triggering voltage in a time period which is a few microseconds less than half the frequency cycle time for the supply voltage. Preferably, resistors 50 and 52 are variable to permit adjustment of the charge rate of capacitor 49 independently of the input signal. The resistors are set to provide a charge rate of capacitor 49 which is just sufficient to charge capacitor 49 at a rate about or slightly less than one-half the source power frequency thereby eliminating any dead band between applied input and circuit response.

A voltage firing circuit is connected to terminal 47 of capacitor 49 and includes a voltage responsive device such as disc 56 or a neon lamp. This device operates as a firing trigger to discharge into the gate of triac 58. Triac 58 is an alternating current semiconductor switch having three erminals, which are power conducting terminals 59 and 60 and gate terminal 61.

The power terminal 59 is connected to the supply voltage and the opposite terminal 60 is connected to the several power circuits 62, 64, 66 and 68 as shown having loads 63, 65, 67 and 69, respectively. In the light control embodiment, each of these loads are one or a plurality of lights which, preferably, are of different and distinct colors. In the simplest embodiment only two power circuits 64 and 66 are used; however, since additional circuits 62 and 68 can also be controlled, it is preferred to utilize these circuits and obtain a more varied visual response in the light control embodiment.

The two circuits 64 and 66 have half wave rectifying means such as diodes 64' and 66'. These diodes thereby render their respective load circuits polarity responsive. Since the rectified voltages of the two control channels are in phase or 180 degrees out of phase with the power voltage supply, each load circuit is thereby responsive to the triggering channel having half wave rectification of the same polarity. Thus load circuit 64 is responsive to the output of the low frequency channel and load circuit 66 is responsive to the output of the high frequency channel.

A supplemental power circuit 62 which receives full wave supply voltage and a complementary power circuit 68 which also receives full wave supply voltage are preferably used in addition to the two polarity responsive circuits. The complementary circuit 68 is in parallel to the triac so that it conducts when the triac is in the non-conducting mode. This load circuit 68 is supplied with full wave current from circuit 62 and opposite half wave currents from each of circuits 64 and 66. The loads in each of circuits 62, 64 and 66 are sized so that there is insufficient current for activation, e.g., insufficient to result in any appreciable light emission from lamps 63, 65 and 67 when their circuits are in series with load circuit 68. The combined currents of these circuits, however, that passes through circuit 68 is sufficient for light emission from lamp 69.

When triac 58 is triggered into a conducting mode, circuit 68 is bypassed and circuit 62 is activated and, depending on the polarity of the supply voltage, either circuit 64 or circuit 66 is activated.

Figure 2:
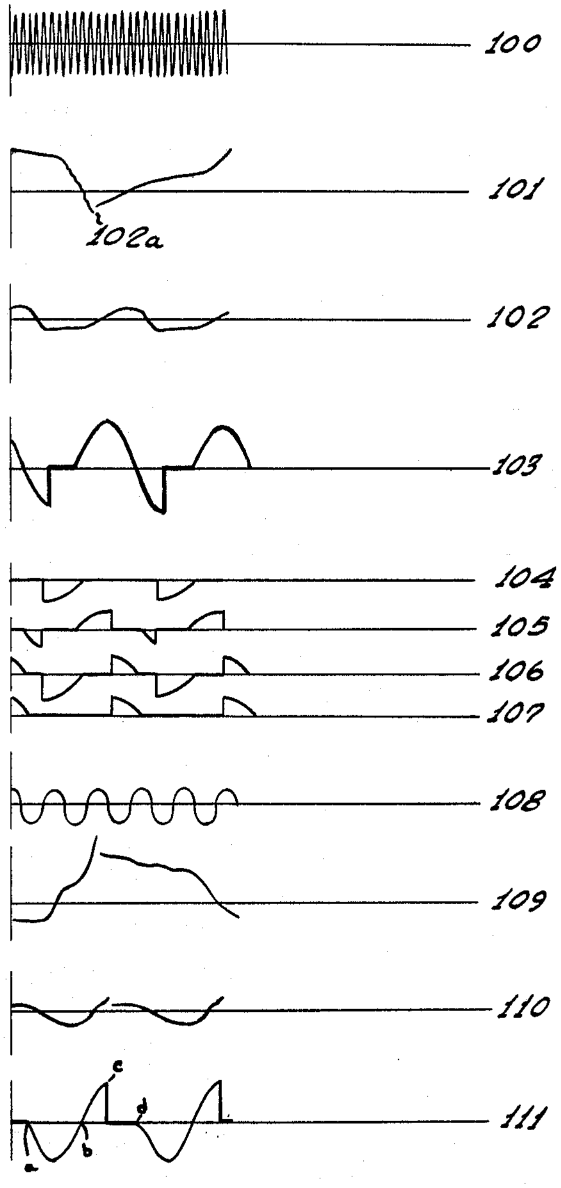
FIGURE 2 depicts the wave forms at selected points in the circuit.

FIGURE 2 illustrates the wave forms appearing at various locations in the circuit. A high frequency input signal applied to terminals 16–18 is shown on line 100. This signal is passed through the high frequency channel, resistor 26 and capacitor 28 and is applied to the base junction 39 of transistor 40. The negative portion of this signal forward biases the transistor during the negative half cycle of the supply voltage and an amplified sawtoothed signal is applied to the charging capacitor 49. This is shown at 102 and also on an expanded scale on 101. At 102*a*, the capacitor has reached the diac discharge voltage, e.g., about 35 volts and the diac discharges into gate 61 of triac 58. This discharge triggers triac 58 into a conducting mode as shown at point 103*a* by the voltage across the triac on line 103.

When the triac is triggered into a conducting mode, a pulse of the remaining portion of the negative half cycle of the supply voltage is applied to circuits 62, 64 and 66. This supply passes through rectified circuit 66 and lamp 67 emits light. The voltage across circuit 66 is shown at 104. The complementary circuit 68 is bypassed during triac conduction and the voltage drop across this circuit is shown also at 103. The circuit 62 also receives the voltage supply through triac 58 and lamp 63 also emits light. The voltage drop across load circuit 62 is shown at 104.

A low frequency input signal is shown at 108. The signal is applied through the RC network comprising resistor 30 and capacitor 32 to the base junction 45 of transistor 42. This NPN transistor is forward biased by positive half cycles of the low frequency input signal during the positive half cycle of the supply voltage. When this occurs, transistor 42 conducts an amplified current and thereby increases the charge rate of capacitor 49. The voltage across the capacitor is shown at 109 on an expanded scale that illustrates the stepwise or incremental effects of the positive half cycles of the audio input signal from points *a* to *b* and *c* to *d* of curve 108. The normal charge rate is shown between points *b* and *c* during the negative half cycle of the audio input as a line on 109 of substantially lesser inclination (rate of change) than the inclination of lines *a–b* and *c–d* of 109.

Curve 110 shows the voltage across capacitor 49 on the same scale as the voltage supply across the triac in curve 111 and across the various load circuits, curves 111 and 107. The triac is in a non-conducting mode during the negative half cycle of the supply voltage from point *a* to *b* of curve 111 since diode 47 only conducts during the positive half cycle. When the supply voltage becomes positive, capacitor 49 is charged as shown from points *a* to *d* in curves 109 and 110 at a rate sufficient to reach the diac breakdown voltage, e.g., 35 volts, within about one-quarter of the supply voltage frequency. The diac then discharges into the triac gate and triggers the triac into a conducting mode at point *c*, curve 111, which is retained until the current through the triac diminishes to less than the minimum holding current at point *d*, curve 111. This occurs substantially when the supply voltage passes through null and the triac then remains non-conducting until the positive half cycle repeats.

The result of the triac switching on the load circuits is shown in curves 107 and 111. When the triac conducts, the voltage across its terminals and the voltags across circuit 62 is shown at curve 111. The combined effect of both a high and low frequency signal input such as 100 and 108 is shown in curves 105 and 106 for circuits 69 and 63, respectively.

The result of the triac triggering is to vary the total power supply to either of at least two and preferably four lamp circuits. These lamps are preferably of a distinct color. The three primary colors can be used to obtain a pleasing visual display with the cool primary color, blue used in the high frequency responsive circuit 64 and the warm primary color, red, used in the low frequency responsive circuit 66. Yellow can be used in circuit 62 while a blend of the primary colors such as violet, green, orange, etc., can be used in the complementary circuit 68. Any variation on this color theme is of course within the scope of this invention.

The preceding illustration of our invention is solely intended to illustrate a mode of practice of the invention and is not intended to be unduly limiting thereof.

We claim:

1. A power control circuit for controlling the amount of power supplied to either of two complementary load circuits that comprises:

(a) a supply of alternating current power;

(b) first and second parallel load circuits connected thereto;

(c) control circuit means connected between said load circuits and said supply to interrupt said power and provide rectified pulses of operating power to said first and second parallel circuits;

(d) trigger circuit means responsive to an input signal having an output connected to said control means to vary the polarity and duration of said pulses of operating power; and (e) rectifier means in said load circuits to render each of said load circuits responsive to pulses of opposite polarities of said operating power.

2. The circuit of claim 1 including a third load circuit connected to the output of said control means and to said supply and in parallel to said first and second load circuits.

3. The circuit of claim 1 including a fourth load circuit connected to said first, second and third load circuits and to said supply and in parallel to said control means.

4. The power control circuit of claim 1 wherein said control circuit means is a triac circuit comprising a triac with one of its conducting terminals connected to said load circuits and the other of its conducting terminals connected to said supply, and trigger means comprising capacitive means connected to the output of said trigger circuit means and a voltage responsive switch connected from said capacitive means to the gate terminal of said triac.

5. The power control circuit of claim 1 wherein said trigger circuit comprises a plurality of signal responsive channels and selector circuits adapted to be supplied with a source signal for segregating discrete signal frequency ranges of the source signal into separate signals of distinct frequencies, signal repeating means in each of said channels responsive to one of said separate signals with the output of said channels connected to said control circuit means and rectification means connecting each of said channels to a supply of alternating current.

6. The power control circuit of claim 5 wherein said repeater means comprises a first semiconductor in a first channel, a second semiconductor of opposite conductivity type in a second channel with common output electrodes.

References Cited

UNITED STATES PATENTS 3,189,747 6/1965 Hoff -------------- 307—38 X

ROBERT K. SCHAEFER, Primary Examiner

H. J. HOHAUSER, Primary Examiner